(12) United States Patent
Nakashima et al.

(10) Patent No.: US 8,359,174 B2
(45) Date of Patent: Jan. 22, 2013

(54) BATTERY PACK, ELECTRONIC APPLIANCE, AND METHOD OF DETECTING REMAINING AMOUNT OF BATTERY

(75) Inventors: Ryoichi Nakashima, Tokyo (JP); Masashi Kumada, Aichi (JP); Hideyuki Sato, Chiba (JP); Yoshio Harada, Kanagawa (JP); Michihiro Kaneko, Tokyo (JP); Kentaro Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 845 days.

(21) Appl. No.: 11/912,845

(22) PCT Filed: Feb. 26, 2007

(86) PCT No.: PCT/JP2007/053495
§ 371 (c)(1),
(2), (4) Date: Feb. 10, 2009

(87) PCT Pub. No.: WO2007/099898
PCT Pub. Date: Sep. 7, 2007

(65) Prior Publication Data
US 2009/0171598 A1    Jul. 2, 2009

(30) Foreign Application Priority Data
Feb. 27, 2006   (JP) ................. 2006-051275

(51) Int. Cl.
*G01R 31/36* (2006.01)
*G01R 19/00* (2006.01)
(52) U.S. Cl. .............. 702/63; 702/64; 702/65; 702/182
(58) Field of Classification Search .............. 702/60–65, 702/182–186, 121–123
See application file for complete search history.

(56) References Cited

U.S. PATENT DOCUMENTS

| | | | | |
|---|---|---|---|---|
| 6,057,688 A | * | 5/2000 | Kawai et al. ................. | 324/428 |
| 6,208,147 B1 | * | 3/2001 | Yoon et al. ................... | 324/430 |
| 2003/0057918 A1 | * | 3/2003 | Aoki et al. .................... | 320/136 |

FOREIGN PATENT DOCUMENTS

| | | | |
|---|---|---|---|
| JP | 2003-092836 | * | 3/2003 |
| JP | 2003-217684 A | | 7/2003 |
| JP | 2005-147815 | | 6/2005 |
| TW | 276302 | | 5/1996 |
| TW | 367630 | | 8/1999 |
| TW | 200404162 A | | 3/2004 |

OTHER PUBLICATIONS

Taiwan IPO Search Report issued in corresponding Taiwanese application No. 096105271 dated Aug. 17, 2010, 1 pg.

* cited by examiner

*Primary Examiner* — Phuong Huynh
(74) *Attorney, Agent, or Firm* — Finnegan, Henderson, Farabow, Garrett & Dunner, L.L.P.

(57) ABSTRACT

A battery pack has a charge and discharge count measuring part (131) configured to measure the number of times of charges and discharges of a secondary battery based on the summed value of the charge current for the secondary battery, and a decay rate output part (132) configured to compute a decay rate that indicates a degree of decay of the secondary battery based on the number of times of charges and discharges measured by the charge and discharge count measuring part (131) and to output it to a device being a discharge load. For example, the charge and discharge count measuring part (131) repeatedly sums the detected values of the charge current to a predetermined threshold, and counts up the number of times of charges and discharges every time when the summed value reaches the threshold. Accordingly, even though charges and discharges are repeated at finer steps in a relatively narrow voltage range, the number of times of charges and discharges can be counted accurately, and the computing accuracy of the decay rate is improved. In the battery pack in which the secondary battery is accommodated, parameters for detecting the remaining amount of the battery are detected more accurately.

19 Claims, 8 Drawing Sheets

US 8,359,174 B2

BATTERY PACK, ELECTRONIC APPLIANCE, AND METHOD OF DETECTING REMAINING AMOUNT OF BATTERY

TECHNICAL FIELD

The present invention relates to a battery pack which accommodates a secondary battery and a processing circuit in one piece therein, the processing circuit performs a predetermined process based on various detected values from the secondary battery, an electronic appliance which receives the supply of power from the secondary battery inside the battery pack to operate, and a method of detecting a remaining amount of a battery in such an electronic appliance.

BACKGROUND OF THE INVENTION

In recent years, for example, portable electronic appliances such as a digital video camera are increasing rapidly, and a great importance is placed on the performance of a secondary battery mounted on these electronic appliances. As one of these secondary batteries, there is a so-called lithium ion type battery.

In addition, in such portable electronic appliances described above using a secondary battery as a power source, many of them have the function of indicating the remaining amount of the battery mounted thereon. Particularly, in a lithium ion secondary battery, since it has properties that the voltage of the battery cell drops gently and linearly except right after the start of discharge and right before the end of discharge, the remaining amount of the battery can be relatively, accurately predicted and indicated.

However, although the secondary battery including the lithium ion type has the capacity that is decided for every battery cell, it has characteristics that the capacity changes depending on the temperature for use. For example, when the battery is used at low temperature, the internal impedance of the battery cell becomes high. Thus, the voltage drop becomes large when it is intended to carry current at the same current value, and the capacity of the battery cell is reduced. In addition, also in the case in which the number of times of charges and discharges is increased because of continuous use, it has characteristics that the capacity is reduced. This is because the repetition of charge and discharge causes the battery cell to be deteriorated, and the usable capacity is reduced.

Then, in a secondary battery before, such functions are provided that the temperature of the battery cell and the number of times of charge and discharge are detected, and the remaining amount of the battery is corrected in accordance with the detected values. For example, there is a secondary battery in which the correction value of the remaining amount corresponding to the detected value of the temperature of the battery cell is set to each of the numbers of times of charge and discharge, and the computation error of the remaining amount of the battery is reduced (for example, see JP-A-2005-147815 (paragraph numbers [0017] to [0026], and FIG. 1)). In addition, in the secondary battery before, it is general that the number of times of charges is detected when the voltage of the battery cell rises and drops around a predetermined threshold.

Moreover, today, in order to more accurately predict the capacity of a battery, such battery packs are commercially available that detection circuits for the voltage and current of the battery cell and microcontrollers for various correction processes are accommodated in the same package as a battery cell. Such battery packs have functions that communicate with a device to be a discharge load and output various detected values thereinside to the device, in which the device having received these detected values computes the remaining amount of the battery as a usable time and indicates it. For example, inside the battery pack, the summed value of current in the battery cell and the decay rate of the capacity based on the temperature and on the number of times of charges and discharges and others described above are detected, in which these values are received on the device side and the remaining amount of the battery can foe computed accurately.

DISCLOSURE OF THE INVENTION

As described above, in order to accurately compute the remaining amount of the battery, it is necessary to accurately detect the summed value of current in the battery cell and the decay rate based on the temperature and on the number of times of charge and discharge. However, as discussed above, in the scheme in which the number of times of charges and discharges is detected based on the comparison of the voltage change in the battery cell when charged and discharged with the threshold, in the case in which charges and discharges are repeated within a relatively narrow voltage range in which the threshold does not pass, such an event can occur that the number of times of charges and discharges is not counted. In this case, it cannot be said that the number of times of charges and discharges is accurately counted, causing a problem that the decay rate cannot be detected accurately. In addition, it is demanded for the process of converting the number of times of charges and discharges into the decay rate that more detailed processes are performed close to realities.

The invention has been made in view of these points. An object is to provide a battery pack which can more accurately detect parameters for detecting the remaining amount of the battery.

In addition, another object of the invention is to provide an electronic appliance which can more accurately detect the remaining amount of the battery.

Moreover, still another object of the invention is to provide a method of detecting a remaining amount of a battery which can more accurately detect the remaining amount of the battery.

In the invention, in order to solve the problems, a battery pack is provided in which a processing circuit which performs a predetermined process based on various detected values from a secondary battery is accommodated in one piece with the secondary battery, the battery pack characterized by comprising: a charge current summing part configured to sum a detected value of charge current for the secondary battery; a charge and discharge count measuring part configured to measure the number of times of charges and discharges of the secondary battery based on the summed value of the charge current by the charge current summing part; a decay rate computing part configured to compute a decay rate that indicates a degree of decay of the secondary battery based on the number of times of charges and discharges measured by the charge and discharge count measuring part; and a communicating part configured to output the decay rate computed by the decay rate computing part to an external device that is a discharge load of the secondary battery.

In the battery pack like this, the decay rate that indicates a degree of decay of the secondary battery is computed as one of parameters for computing the remaining amount of the secondary battery in an external device to be a discharge load. The charge current summing part sums the detected values of the charge current for the secondary battery. The charge and discharge count measuring part measures the number of times of charges and discharges of the secondary battery based on the summed value of the charge current by the charge current summing part. The decay rate computing part computes the decay rate that indicates the degree of decay of the secondary battery based on the number of times of charges and discharges measured by the charge and discharge count measuring part. The communicating part outputs the decay rats computed by the decay rate computing part to the external device.

BEST MODE FOR CARRYING OUT THE INVENTION

Hereinafter, an embodiment of the invention will be described in detail with reference to the drawings. In addition, in the embodiment below, a digital camera is taken as an example and described which operates using a secondary battery as a power source.

Figure 1:
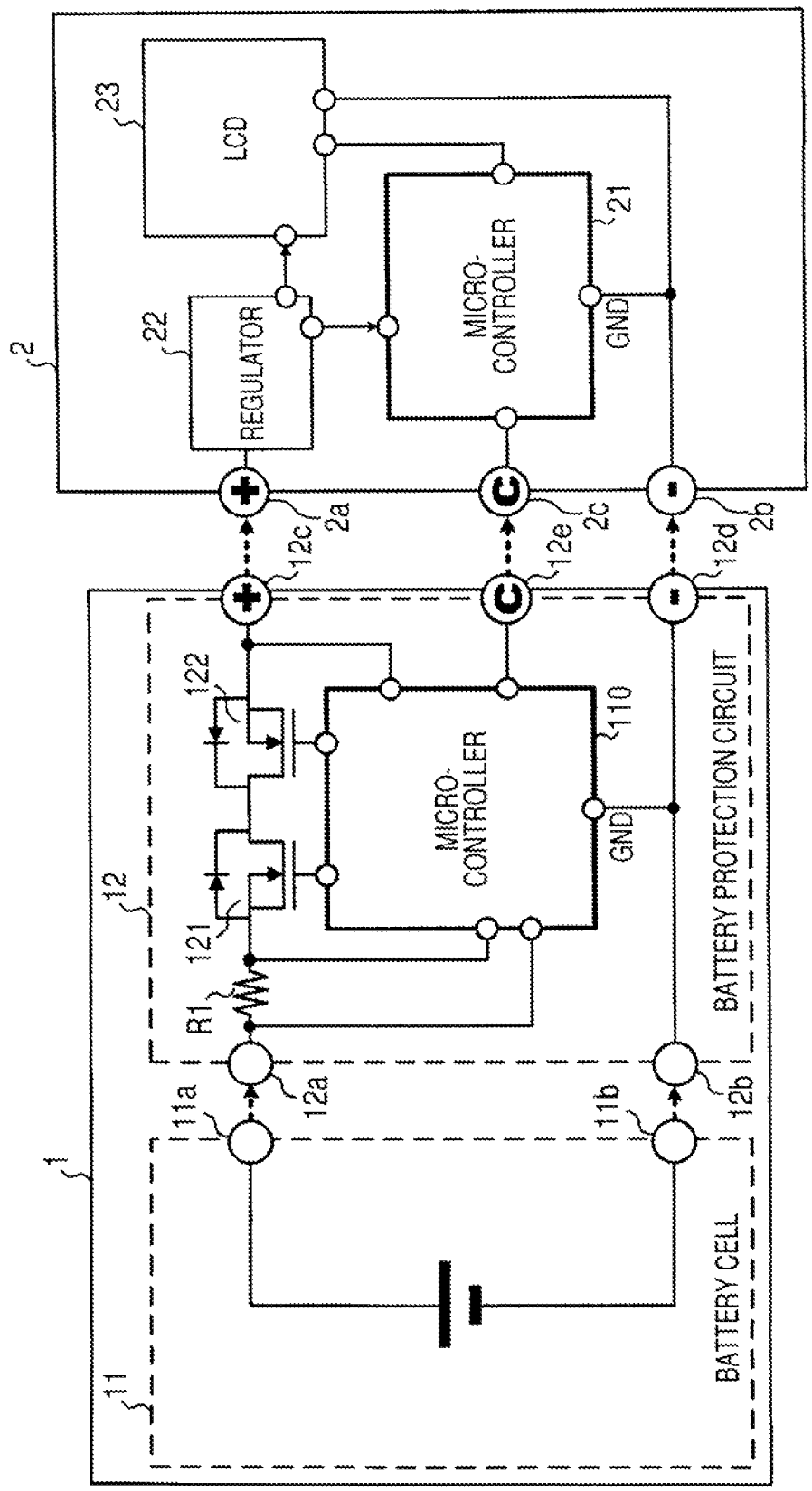
FIG. 1 shows a diagram depicting the configuration of the essential part of a digital camera and a battery pack according to an embodiment of the invention.

FIG. 1 shows a diagram depicting the configuration of the essential part of a digital camera and a battery pack according to the embodiment of the invention.

A battery pack 1 shown in FIG. 1 accommodates in a package in one piece a battery cell 11 which is formed of a secondary battery, and a battery protection circuit 12 which mainly implements the function of protecting the battery cell 11 against abnormal states. In addition, a digital camera 2 is an apparatus that images an image by a solid state imaging device (not shown) and records the image as digital data on a recording medium (not shown) and that operates with the supply of power from the battery pack 1.

In the battery pack 1, a positive terminal 11a and a negative terminal 11b of the battery cell 11 are connected to a positive terminal 12a on the cell side and a negative terminal 12b on the cell side of the battery protection circuit 12, respectively, by welding, for example. In addition, an external positive terminal 12c and an external negative terminal 12d of the battery protection circuit 12 are a feed terminal that supplies electric power to the digital camera 2, and also serves as a terminal that receives power supply from an external charger.

Moreover, the battery protection circuit 12 is also provided with a control terminal 12e which communicates with the digital camera 2.

The battery protection circuit 12 has a microcontroller 110, a charge control FET (Field Effect Transistor) 121, a discharge control FET 122, and a current detecting resistor R1. In the battery protection circuit 12, the microcontroller 110 controls the operations of the charge control FET 121 and the discharge control FET 122 in accordance with the voltage and the charge and discharge current of the battery cell 11, whereby the function of protecting the battery cell 11 is implemented when abnormal conditions occur. Along with this, such a function is also provided that parameters are computed in the digital camera 2 that are necessary to accurately indicate the remaining capacity of the battery cell 11 and the parameters are sent to the digital camera 2 through the control terminal 12e.

In addition, for the battery cell 11, for example, a lithium ion type secondary battery can be used. Such a secondary battery is used that has discharge characteristics which discharge voltage relatively, gently and linearly drops like the lithium ion secondary battery, whereby the remaining amount of the battery is highly accurately detected on the digital camera 2 side, and the remaining amount of the battery can be indicated, as a remaining usable time, for example.

On the other hand, in the digital camera 2, the external positive terminal 12c and the external negative terminal 12d of the battery pack 1 are connected to power source terminals 2a and 2b, whereby the camera receives the power supply from the battery pack 1. In addition, the digital camera 2 has a control terminal 2c which communicates with the battery pack 1, and can receive parameters necessary to indicate the remaining amount of the battery from the battery protection circuit 12.

The digital camera 2 has a microcontroller 21 which generally controls the overall apparatus, a regulator 22 which stabilizes the applied voltage from the power source terminal 2a to a predetermined voltage and supplies it inside the apparatus, and a display which shows thereon a through image of a camera for aligning the angle of view, a reproduced image based on image data recorded on the recording medium, the remaining amount of the battery, and so on (here, it is an LCD (Liquid Crystal Display) 23 as an example).

Figure 2:
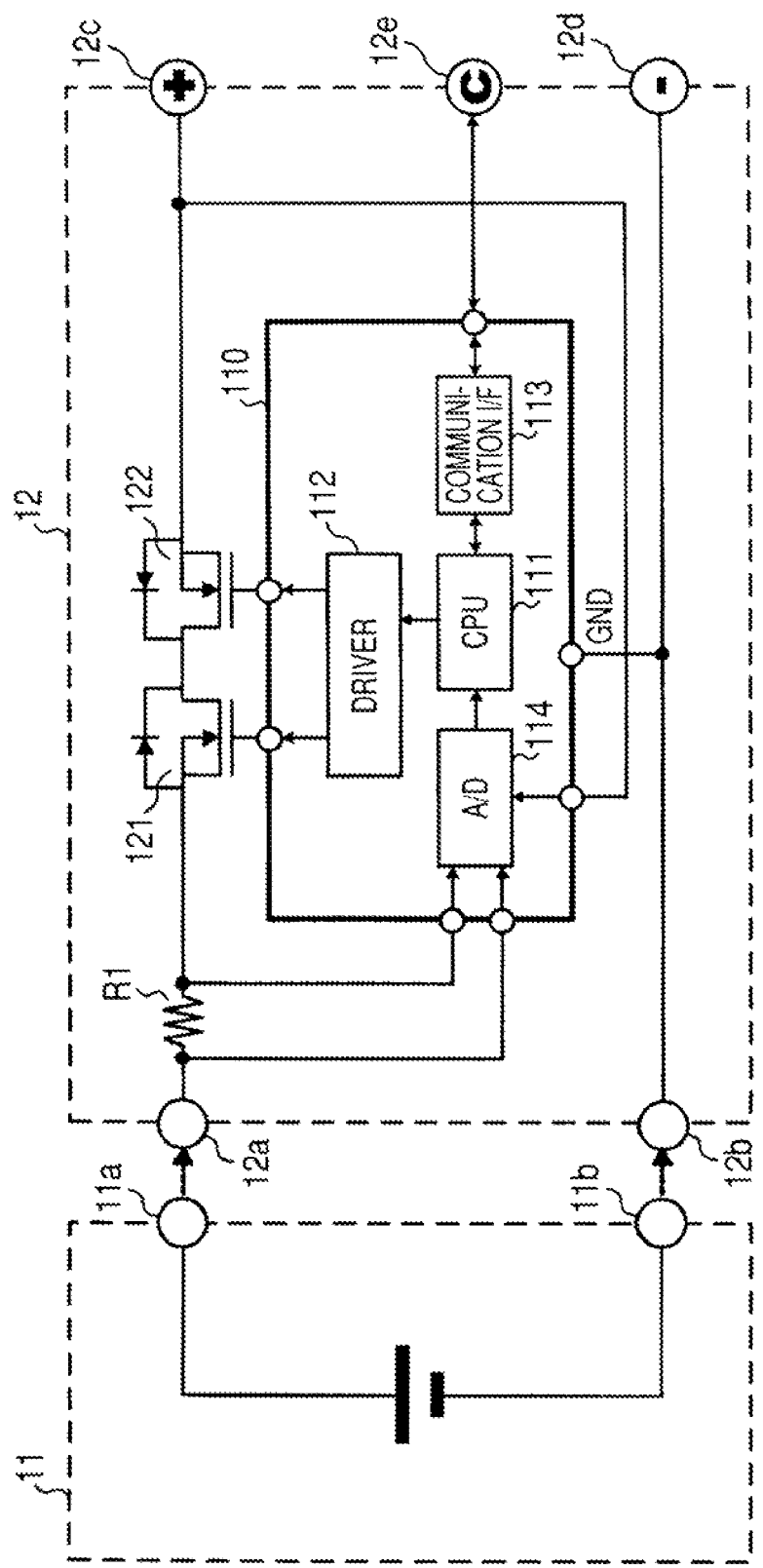
FIG. 2 shows a diagram depicting the hardware configuration of a battery protection circuit.

FIG. 2 shows a diagram depicting the hardware configuration of the battery protection circuit.

As shown in FIG. 2, the microcontroller 110 inside the battery protection circuit 12 has a CPU (Central Processing Unit) 111, a driver 112, a communication interface circuit 113, and an A/D converter circuit 114.

The CPU 111 executes a program stored in a non-volatile memory, not shown, whereby it performs various computations and controls for implementing the function of protecting the battery cell 11 described above, and the function of processing the computations of the remaining amount of the battery. Under control done by the CPU 111, the driver 112 outputs the gate voltages of the charge control FET 121 and the discharge control FET 122, and drives the individual FETs. The communication interface circuit 113 is an interface that performs serial communications, for example, which is connected to the digital camera 2 through the control terminal 12e and communicates between the digital camera 2 and the CPU 111 in accordance with a predetermined format.

The A/D converter circuit 114 detects the voltage on both ends of the resistor R1 which is inserted between the positive terminal 12a on the cell side and the charge control FST 121 and the voltage on the external positive terminal 12c, converts them into digital signals, and supplies them to the CPU 111.

Accordingly, the CPU 111 can detect the presence of the start of charge based on the voltage of the battery cell 11 (hereinafter, referred to as cell voltage) and the voltage of the external positive terminal 12c, and the magnitude of the charge and discharge current any time.

The charge control FET 121 and the discharge control FET 122 are formed of a MOSFET (Metal Oxide Semiconductor FST) in which a diode is equivalently incorporated between the source and the drain, and the FETs function as a protection switch when the battery cell 11 is charged and discharged under control done by the microcontroller 110. In other words, the charge control FET 121 can selectively block charge current to the battery cell 11 and can charge from the charger to the battery cell 11 when conducted. In addition, the discharge control FET 122 can selectively block the discharge current of the battery cell 11, discharge the battery cell 11 when conducted, and then supply power source to the digital camera 2, Then, the CPU 111 controls these FSTs in accordance with the cell voltage, the charge and discharge current, and the detection of the presence of the start of charge, whereby the function of protecting the battery cell 11 is implemented.

In addition, although not shown in the drawings, the microcontroller 21 provided in the digital camera 2 is formed of a CPU and a memory, in which a program stored in the memory is executed by the CPU to implement various control functions inside the apparatus and the computation function of indicating the remaining amount of the battery and others.

Next, the function of indicating the remaining amount of the battery which is implemented in the battery pack 1 and the digital camera 2 will be described in detail. First, FIG. 3 shows a diagram depicting an exemplary indication of the remaining amount of the battery in the digital camera.

Figure 3:
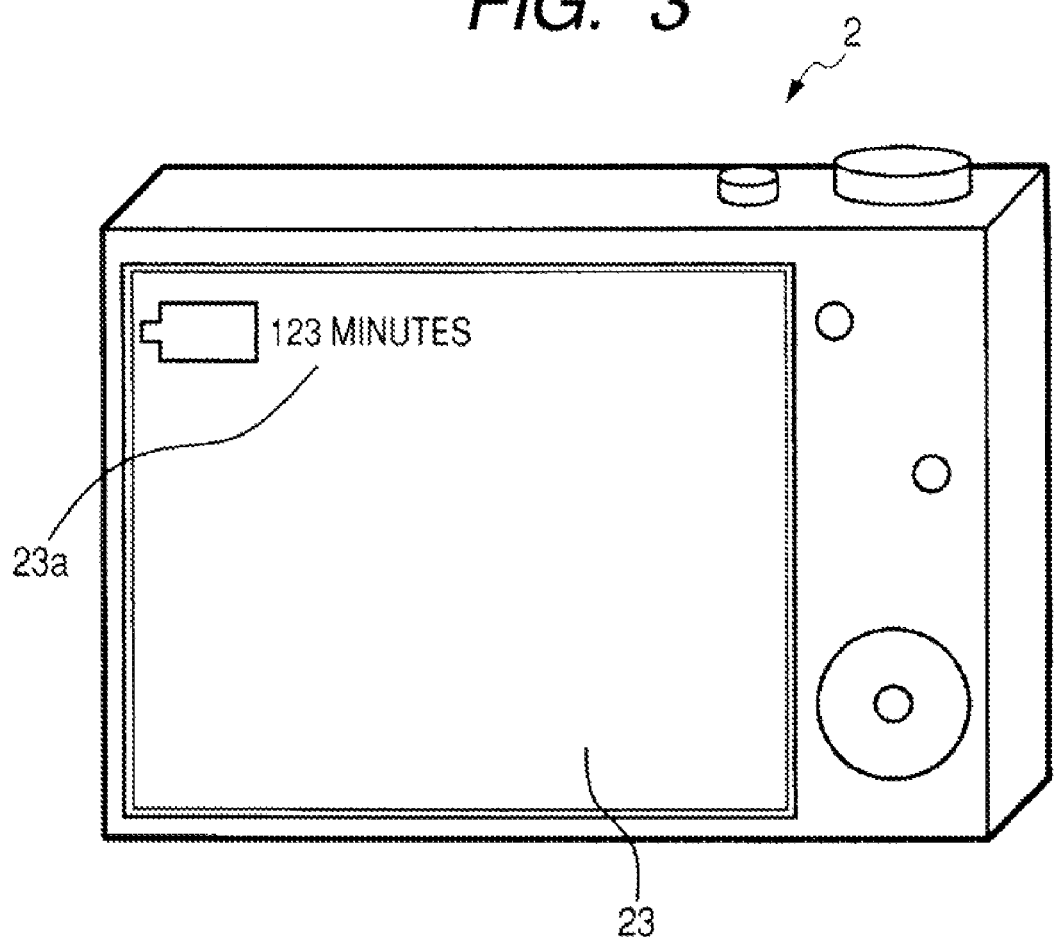
FIG. 3 shows a diagram depicting an exemplary indication of the remaining amount of the battery in the digital camera.

In the digital camera 2, as shown in FIG. 3, on the back side opposite to the imaging side on which the lens and others are provided, the LCD 23 is disposed for aligning the angle of view and reproducing images. Then, on the screen of the LCD 23, a remaining amount indication image 23a is displayed which indicates the remaining amount of the battery by OSD (On Screen Display), for example. In the embodiment, the remaining amount of the battery is displayed as a remaining usable time, and on the remaining amount indication image 23a, the remaining time is displayed as numerals in units of minutes, for example. Moreover, in addition to this, for example, in the case in which an electronic view finder formed of LCD is provided, the remaining amount indication image 23a may be displayed on the electronic view finder. In addition, the remaining amount may be displayed on a display part different from the display for image display.

Figure 4:
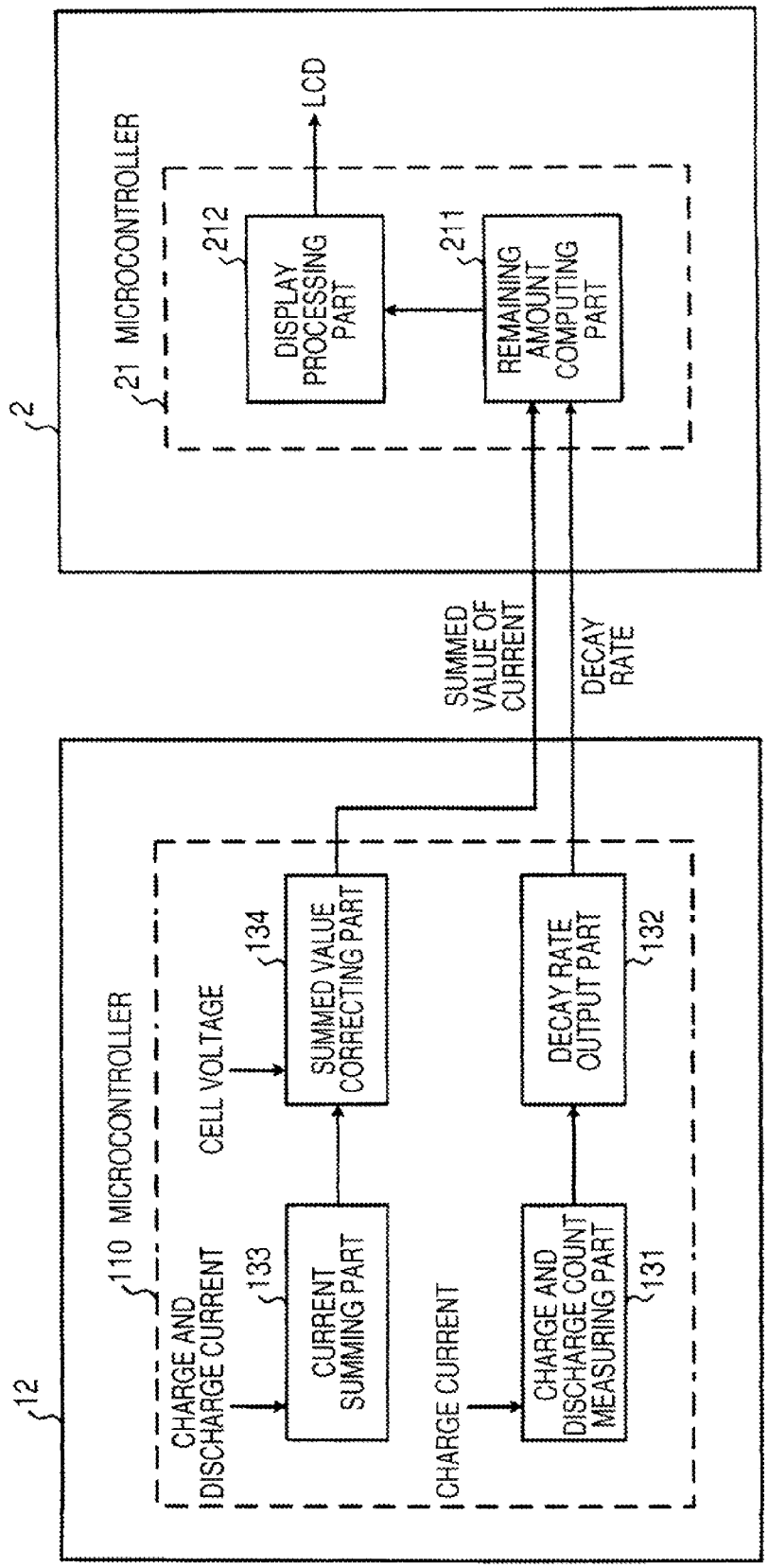
FIG. 4 shows a block diagram depicting the battery protection circuit and the function of indicating the remaining amount of the battery in the digital camera.

FIG. 4 shows a block diagram depicting the function of indicating the remaining amount of the battery in the battery protection circuit and the digital camera.

The digital camera 2 has a remaining amount computing part 211 and a display processing part 212 as the function of indicating the remaining amount of the battery. The function of these parts is implemented by the microcontroller 21. In addition, the battery protection circuit 12 has a charge and discharge count measuring part 131, a decay rate output part 132, a current summing part 133, and a summed value correcting part 134 as the function of indicating the remaining amount of the battery. The functions of these parts are implemented by the microcontroller 110.

The remaining amount computing part 211 of the digital camera 2 computes the remaining amount of the battery as a remaining usable time in accordance with the following equation:

The remaining amount of the battery(minute)={(the summed value of current of the moment[mAh]× (1−decay rate))/the summed value of current in full charge[mAh]}×(the shooting time per 1.0 W [minute·W]/the power consumption [W])

Here, the summed value of current of the moment is the summed value of the charge and discharge current in the battery cell 11. In addition, the decay rate is an exponent that expresses the degree of decay of the battery cell 11, taking a value from 0 to 1. In other words, it indicates that the battery cell 11 is a new one with no decay when the decay rate is 0, it indicates that the battery cell 11 is more decayed as the decay rate is larger, and it indicates that the battery cell 11 is most decayed and charge and discharge cannot be done at ail when the decay rate is 1. Particularly in the embodiment, in view of the fact that the battery capacity is more reduced as the number of times of charges and discharges is larger, it is considered that the decay rate shows the rate of decreasing the capacity in accordance with the number of times of charges and discharges in the battery cell 11.

The summed value of current of the moment and the decay rate are received from the battery pack 1 side through the control terminal 2c. In addition, the other parameters are the values decided depending on the specifications of the digital camera 2 itself, which are stored in advance in a non-volatile memory not shown in the drawing in the digital camera 2, and read and used when the remaining amount is computed.

The display processing part 212 generates the remaining amount indication image 23a described above based on the remaining amount of the battery computed by the remaining amount computing part 211, combines it on an image to be displayed on the LCD 23, and supplies the signals of the combined image to the LCD 23. Thus, the remaining amount indication image 23a which indicates the computed remaining amount of the battery (time information) is displayed on the LCD 23.

On the other hand, in the battery protection circuit 12, the charge and discharge count measuring part 131 detects the charge current to the battery cell 11 based on the voltage at both ends of the resistor R1, and counts the number of times of charges and discharges in the battery cell 11 on the basis of the summed value of current. The decay rate output part 132 computes the decay rate based on the count value of the number of times of charge and discharge, and outputs it to the remaining amount computing part 211 of the digital camera 2. The current summing part 133 detects the charge current and the discharge current based on the voltage at both ends of the resistor R1, and sums the current values. The summed value correcting part 134 corrects the summed value by the current summing part 133 in accordance with the cell voltage, and outputs it to the remaining amount computing part 211 of the digital camera 2.

Figure 5:
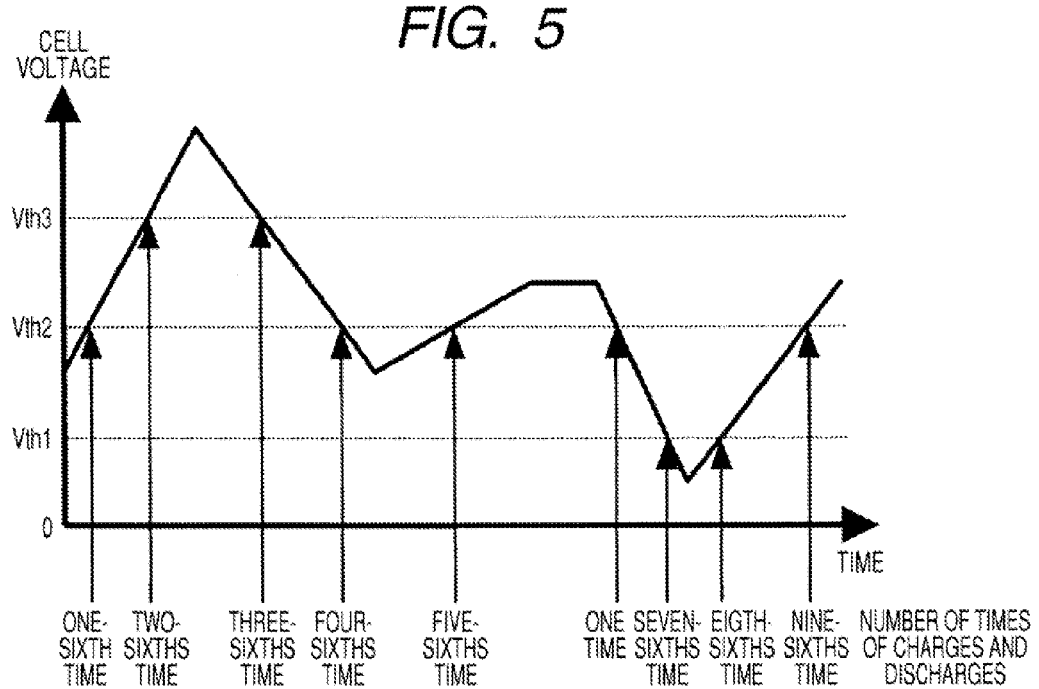
FIG. 5 shows a diagram illustrative of a scheme of measuring the number of times of charges and discharges before.

Next, the individual functions provided in the battery protection circuit 12 will be described. First, a scheme of measuring the number of times of charges and discharges for determining the decay rate will be described. FIG. 5 shows a diagram illustrative of the scheme of measuring the number of times of charges and discharges before for reference purposes.

As described above, the decay rate is an exponent that expresses the degree of decay of the battery cell 11, and the chargeable and dischargeable capacity of the battery cell 11 is proportional to the value (1−the decay rate). Since the decay rate becomes higher as the number of times of charges and discharges of the battery cell 11 is larger, in order to determine the decay rate, the number of times of charges and discharges of the battery cell 11 is measured by the charge and discharge count measuring part 131. Here, the number of times of charges and discharges basically indicates the number of times of operation that the state of the cell voltage is first 0, turned to full charge, and returned to the voltage 0. Heretofore, the number of times of charges and discharges like this has been measured based on the conditions of increase and decrease in the cell voltage.

FIG. 5 shows exemplary changes in the cell voltage. As shown in FIG. 5, in the manner before, a plurality of thresholds is defined to the cell voltage (here, Vth1 to Vth3). In the cases in which the cell voltage rises as passing through the threshold and the cell voltage drops as passing through the threshold, the number of times of charges and discharges is counted. However, an amount of counts for one time is set finer in accordance with the number of steps of thresholds. In this example, since three steps of thresholds are defined, it is assumed as a single charge that the state of the cell voltage is first 0, turned, to full charge, and returned to the voltage 0, in which every time when the cell voltage is changed as passing through a single threshold, the number of times of charges and discharges is counted for one-sixth time each.

However, according to this scheme, in the case in which charges and discharges are repeated in a relatively narrow voltage range in which the threshold is not passed, the number of times of charges and discharges is not counted. In other words, when charges and discharges are repeated in the range of the same cell voltage, although it can be considered that the progress of decay is almost the same, the number of times of charges and discharges to be counted is varied depending on whether, the range of changes in the cell voltage includes the threshold. As described above, in the scheme of measuring the number of times of charges and discharges before, it cannot be said that the number of times of charges and discharges is accurately counted, causing a problem that there is the case in which the decay rate cannot be accurately detected to deteriorate the computing accuracy of the remaining amount of the battery.

Figure 6:
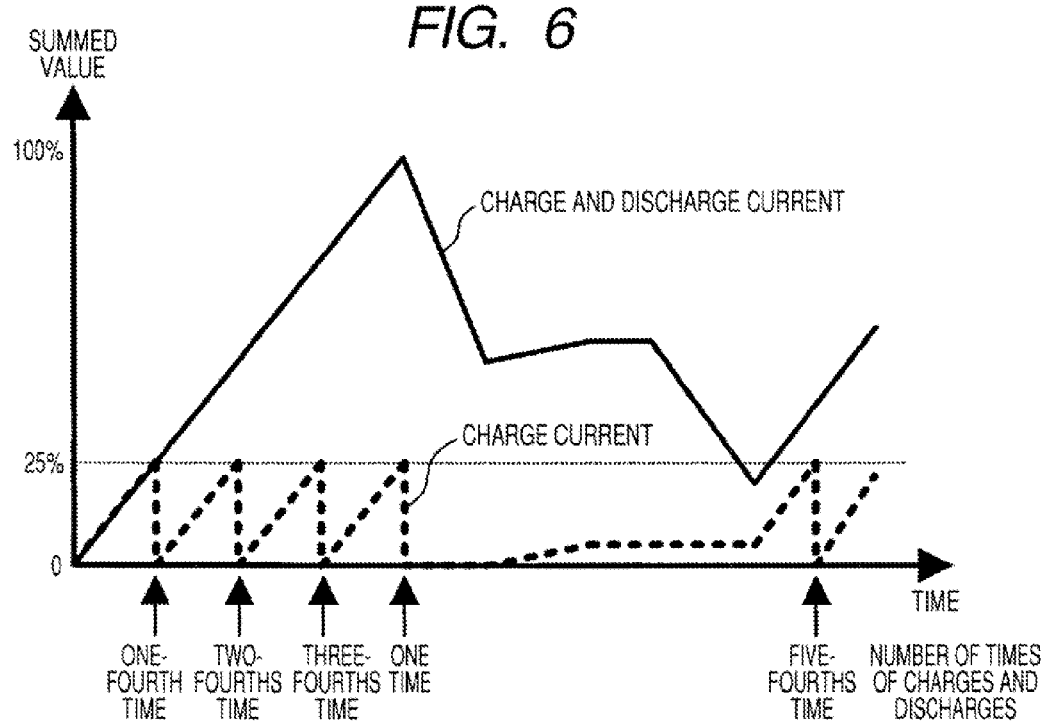
FIG. 6 shows a diagram illustrative of a scheme of measuring the number of times of charges and discharges according to the embodiment.

FIG. 6 shows a diagram illustrative of a scheme of measuring the number of times of charges and discharges according to the embodiment.

In contrast to the scheme before described above, the charge and discharge count measuring part 131 according to the embodiment counts the number of times of charges and discharges based on the summed value of current of the battery cell 11, In addition to this, according to this scheme, it is characterized in that the number of times of charges and discharges is counted based on the value that sums only the current (charge current) when charged.

In FIG. 6, changes in the summed value of the charge and discharge current in association with charge and discharge operations are depicted by solid lines, and the summed value of the charge current at this time is depicted by doted lines. In addition, the threshold of the summed value of the charge current that counts the number of times of charges and discharges is set to 25% of the summed value of the charge current in full charge as an example. On this account, a count is made for every one-fourth time so that four counts are made and then the number of times of charges and discharges is one time, which makes errors small. In addition, with this scheme, for example, even in the case in which the summed value is reset before reaching the threshold and the summed value is cleared, an advantage is produced that can prevent the summed value from, greatly deviating.

With this scheme, even though charges and discharges are repeated at finer steps in a relatively narrow voltage range, the number of times of charges and discharges can be counted accurately. Particularly, counts are made based on the summed value of the charge current, not on the discharge current, whereby the measuring accuracy of the number of times of charges and discharges can be improved. For example, a slight discharge current is sometimes carried due to natural discharge even though the external positive terminal 12c and the external negative terminal 12d of the battery pack 1 are in the open state. However, a slight current might not be detected by summing the discharge current. On this account, the number of times of charges and discharges is counted based on the discharge current, which causes great errors of the number of times of charge and discharge. Therefore, the number of times of charges and discharges is measured based on the summed value of the charge current to improve the measuring accuracy.

In addition, when the slight current is allowed to be detected in the case in which the discharge current is summed, it is necessary to increase the resolution of the summed value of current, and then the memory size for holding the summed value becomes large. In contrast to this, the charger is connected to continuously carry a larger current when the battery cell 11 is charged than when discharged. Thus, in the case of summing the charge current, the resolution for summing can be reduced, and the memory size for holding the summed value can be made smaller as well. In addition, since the summed value of the charge current does not exceed a constant value (25% in the example above), the memory area for holding the summed value can be a constant size.

In addition, even though the threshold of the summed value of the charge current for counting the number of times of charges and discharges is made to a relatively large value such as 25%, the measuring accuracy of the number of times of charges and discharges can be maintained. Therefore, the memory size for holding the count value of the number of times of charges and discharges can be made smaller as well.

Now, according to the scheme above, the number of times of charges and discharges is counted every time when the summed value of the charge current reaches a constant value. However, in addition to this, for example, as described below, the advantage of improving the measuring accuracy of the number of times of charges and discharges can be obtained as similar to the description above by such a scheme that counts are made at every fixed time period.

Figure 7:
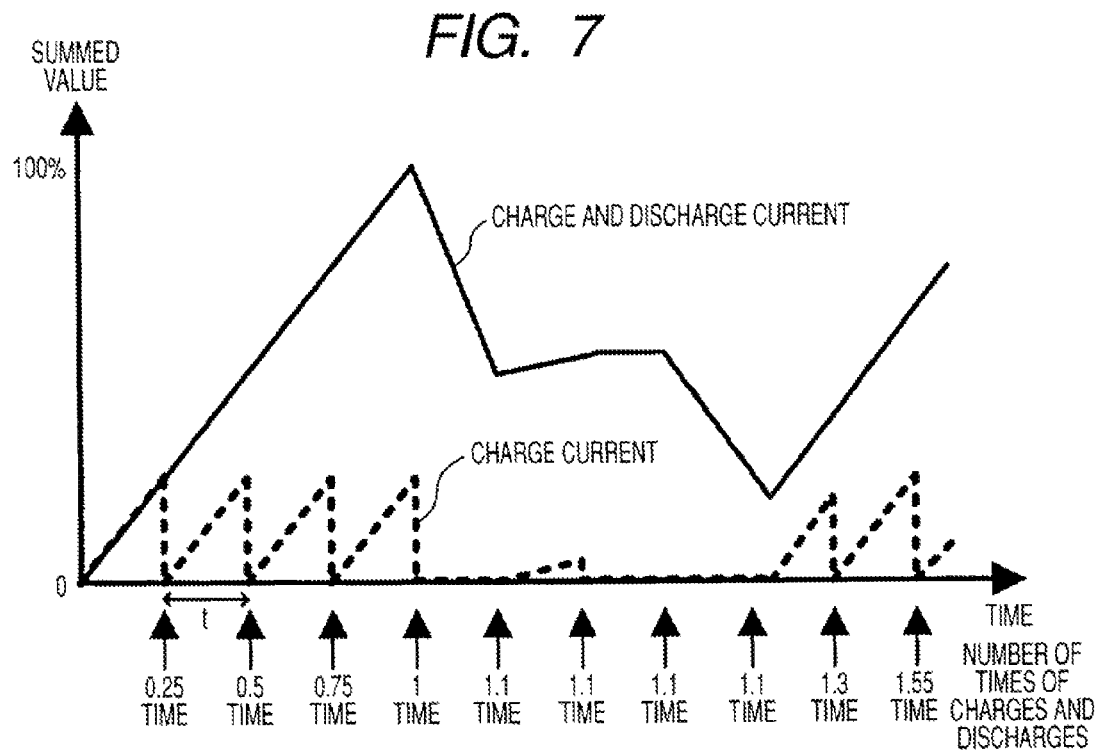
FIG. 7 shows a diagram illustrative of another exemplary scheme of measuring the number of times of charge and discharge.

FIG. 7 shows a diagram illustrative of another exemplary scheme of measuring the number of times of charge and discharge.

In this measuring scheme, as shown in FIG. 7, the charge and discharge count measuring part 131 computes the added value of the number of times of charges and discharges based on the summed value of the charge current at every fixed time period t. The added value is computed by dividing the summed value of the charge current at a fixed time period t by the summed value of current in full charge, and the value that the computed added value is added to the number of times of charges and discharges computed at this point in time is outputted to the decay rate output part 132.

In the measuring scheme, it is sufficient to perform the computation of the number of times of charges and discharges in matching with the timing of outputting the decay rate by the decay rate output part 132. Therefore, the number of computations for the number of times of charges and discharges can be reduced, and there is a merit of easy control. On the other hand, it is necessary to reduce the value of the number of times that corresponds to LSB (Least Significant Bit) in binary data indicating the number of times of charge and discharge, and the memory size for holding the number of times of charges and discharges is greater. For example, the measuring accuracy as similar to the example in FIG. 6 cannot be obtained unless otherwise the number of times corresponding to LSB is not made smaller than one-fourth time. In addition, in order to allow the detection of the maximum charge current carried at a fixed time period t when quick charge, since it is necessary to decide the size of a buffer for storing the summed value of current, the buffer size is made larger as well. Therefore, in consideration of the merit and demerit above, it is sufficient to select a suited measuring scheme in FIG. 6 or FIG. 7.

As described above, the number of times of charges and discharges is measured, and then the decay rate output part 132 outputs the decay rate based on the measured result. In the manner before, the decay rate has been computed by a simple linear correction as shown in FIG. 8.

Figure 8:
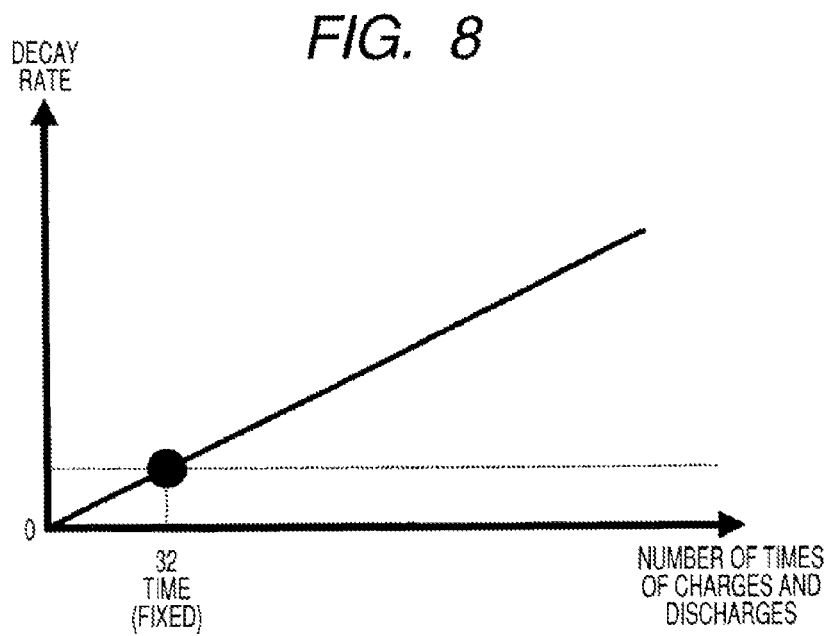
FIG. 8 shows a diagram illustrative of a scheme of computing the decay rate before.

FIG. 8 shows a diagram illustrative of a scheme of computing the decay rate before for reference purposes.

In the manner before, a linear line shown in FIG. 8 is used to convert the number of times of charges and discharges into the decay rate. In FIG. 8, the decay rate at the time that charges and discharges are repeated for 32 times as an example in advance, and the linear line created based on the measured result is shown. Therefore, suppose the decay rate is 0.1 when the number of times of charges and discharges is 32 times, the decay rate is computed as 0.2 when the number of times of charges and discharges is 64 times. Alternatively, in the manner before, the number of times of charges and discharges is split into a plurality of steps based on such a linear line, and the number of times is converted into the decay rate at each step. However, in practice, since the relation between the number of times of charges and discharges and the decay rate does not take a linear line, the errors of the decay rate are large. On this account, the remaining amount of the battery can not be indicated accurately.

Figure 9:
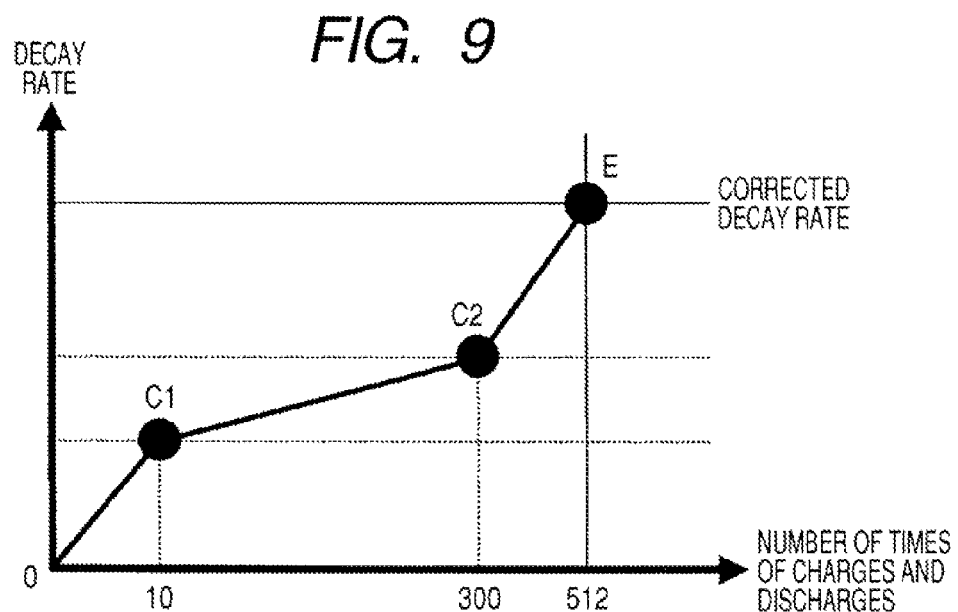
FIG. 9 shows a graph used for computing a decay rate according to the embodiment.

FIG. 9 shows a graph for use in computing the decay rate in the embodiment.

Generally, in the secondary battery, it is known that in the case in which the number of times of charges and discharges is small, the decay rate is greatly increased, after that, the increase rate becomes gentle, and then the increase rate is again great after a certain number of times is exceeded. For example, some of lithium ion secondary batteries have such characteristics that the decay rate is suddenly increased in the range of the number of times of charges and discharges from, zero to about ten, the decay rate is increased gently in the range of the number of times of charges and discharges from about 10 to about 300, and the decay rate is again suddenly increased after the number of times of charges and discharges exceeds about 300.

Then, in the embodiment, as shown in FIG. 9, points of change C1 and C2 are set at which the slope of an increase in the decay rate changes, line interpolation is applied to connect the points of change, and the generated graph is used to convert the number of times of charges and discharges into the decay rate. In the example shown in FIG. 9, the point of change C1 is set to the position at which the number of times of charges and discharges is ten, and the point of change C2 is set at the position at which the number of times of charges and discharges is 300. In addition, an end point of correction E in FIG. 9 is set on the conversion line when the number of times of charges and discharges is greater than 300, which shows the limit of the number of times of charges and discharges on specifications. It is sufficient that the points of change and the end point of correction are set at the positions corresponding to the characteristics of the battery cell 11.

The graph described above is used to convert the number of times of charges and discharges into the decay rate, whereby the computation error of the decay rate can be deceased.

Accordingly, with the combined use of the scheme of measuring the number of times of charge and discharge described above, a more accurate decay rate can be outputted to the remaining amount computing part 211 of the digital camera 2, and the remaining amount of the battery can be more accurately computed and indicated.

Next, the scheme of computing the summed value of current to be outputted to the remaining amount computing part 211 of the digital camera 2 will be described. In the battery protection circuit 12, the current summing part 133 sums the charge and discharge current of the battery cell 11. The current summation is basically performed in such a way that when the charge current is detected, the magnitude of current is added, whereas the discharge current is detected, the magnitude of current is subtracted. In this manner, it is known that since the summed value of current is computed by repeating summations and subtractions, errors tend to occur, and the errors are greater over time to degrade the computing accuracy. For example, as described above, this is one of causes of occurrence of errors that a slight discharge current due to natural discharge cannot be detected in the case in which neither a discharge load nor a charger is connected to the battery pack 1. Then, it has been considered from before that the summed value of current is corrected.

Figure 10:
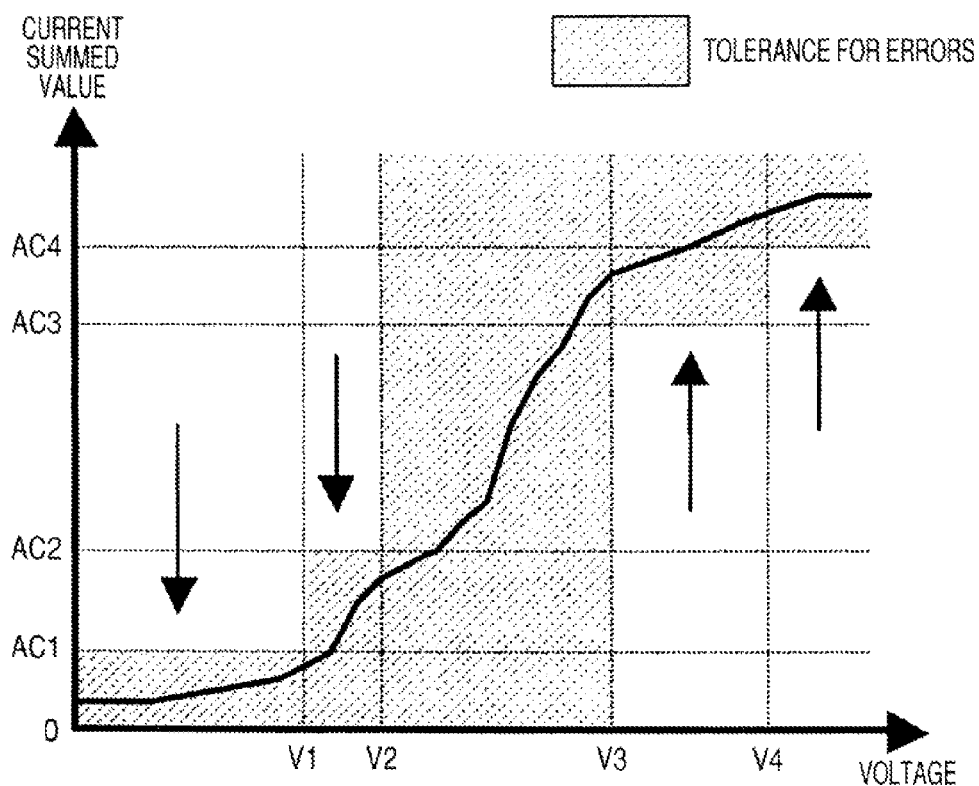
FIG. 10 shows a diagram illustrative of a scheme of correcting the summed value of current before.

FIG. 10 shows a diagram illustrative of a scheme of correcting the summed value of current before for reference purposes.

It is known that there is a certain relation between the summed value of the charge and discharge current and the voltage of the battery cell 11. A curve shown in a graph in FIG. 10 depicts the relation between the voltage and the summed value of the charge and discharge current when the electrode terminal of the battery cell 11 is opened based on the characteristics. Such a curve is used as a correction curve to approximate the summed value of current detected from the charge and discharge current to the summed value of current on the correction curve in accordance with the voltage of the battery cell 11 at this time, whereby the errors of the summed, value of current can be reduced. It is necessary that the correction like this is performed at the time when the electrode terminal of the battery cell 11 is opened. In the manner before, the correction is performed only one time after charge is completed, in order to suppress power consumption. In addition, a correction using such a correction curve is called OCV (Open Circuit Voltage) correction.

However, in the manner before, there are a few number of battery packs that have the correction function of the summed value of current using the correction curve like this, and even the battery packs having the function only perform a simple correction at intervals of a few steps.

For example, as shown in FIG. 10, a plurality of steps is set for the voltage of the battery cell 11 and the summed value of current. In FIG. 10, four steps V1 to V4 are set for the voltage, and four steps AC1 to AC4 are set for the summed value of current as well. Then, in the areas on the graph generated by these steps, the area including the correction curve is defined as the area for permitting errors (the tolerance for errors). In the case in which when the summed value of the charge and discharge current is measured, the summed value is included in the tolerance for errors corresponding to the voltage of the battery cell 11 at this time, the summed value is not corrected and outputted as it is. In addition, in the case in which the summed value is not included in the tolerance for errors, the summed value is corrected to the value on the border of the tolerance for errors.

For example, in the case in which the voltage of the battery cell 11 is 0 or below V1, no correction is made if the measured summed value of current is equal to or below AC1, whereas the summed value of current is corrected to AC1 and outputted if the value is above AC1. Alternatively, in the case in which the voltage of the battery cell 11 is equal to V3 or below V4, no correction is made if the measured summed value of current is equal to or above AC3, whereas the summed value of current is corrected to AC3 and outputted if the value is below AC3. In addition, since the errors of the summed value of current relatively tend not to occur in the case in which the voltage of the battery cell 11 exists in the intermediate area with respect to the maximum voltage, in the intermediate area like this (in FIG. 10, the area equal to V2 and below V3), the summed value of current is not corrected.

Since the correcting scheme like this has a smaller number of split steps, the scheme can be performed by relatively simple processing, and the power consumption of the microcontroller for performing the scheme is small as well. However, it cannot be said that the correcting accuracy is high, and it is demanded to perform more highly accurate correction. Particularly, in recent years, this demand is increasing in association with a smaller power consumption of the microcontroller for correction.

Figure 11:
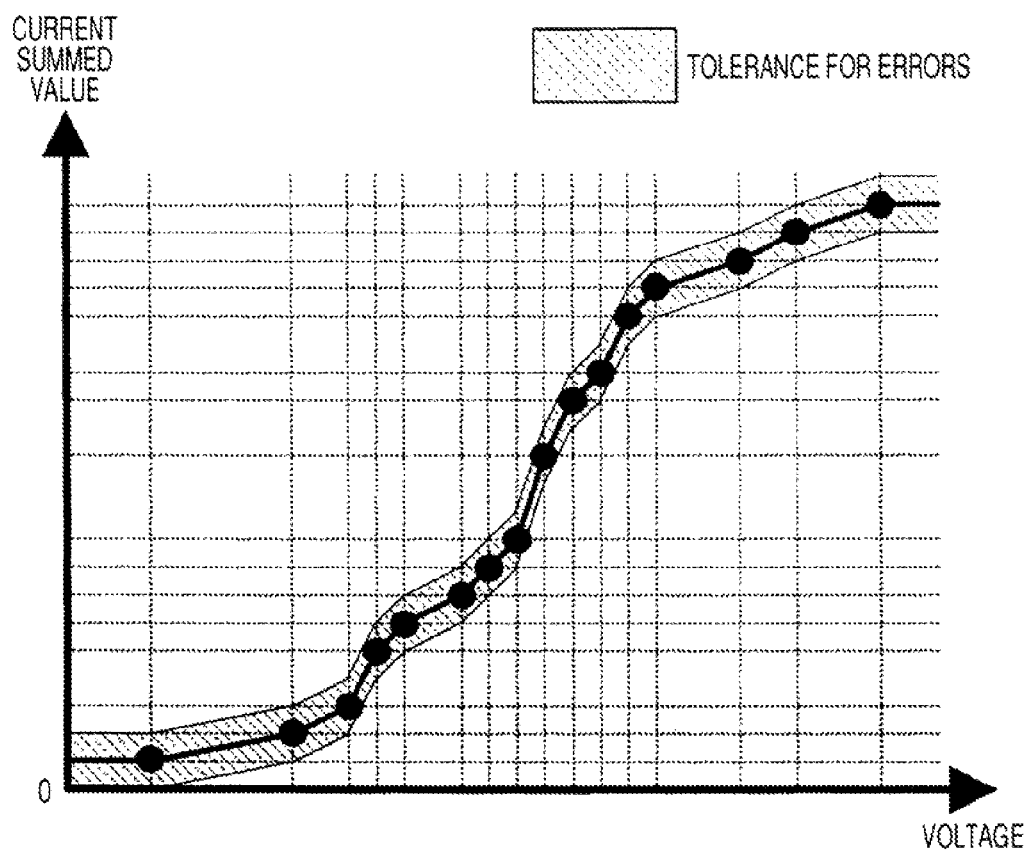
FIG. 11 shows a diagram illustrative of a scheme of correcting the summed value of charge and discharge current according to the embodiment.

FIG. 11 shows a diagram illustrative of a scheme of correcting the summed value of charge and discharge current according to the embodiment.

As shown in FIG. 11, in the embodiment, correction points greater than before are set on the same correction curve as that described above (in FIG. 11, 16 points, for example), and the individual correction points are connected by a linear line to generate an approximated graph. Then, around the graph, a predetermined range is set to the tolerance for errors by ±0.4%, for example.

In the case in which the summed value is included in the tolerance for errors corresponding to the voltage of the battery cell 11 at this time when the summed value of the charge and discharge current is measured based on the preset tolerance for errors, the summed value correcting part 134 of the battery protection circuit 12 does not correct the summed value, and outputs it as it is. In addition, in the case in which the summed value is greater than the upper limit of the tolerance for errors, the summed value is corrected to the upper limit value of the tolerance for errors, whereas in the case in which the summed value is below the lower limit of the tolerance for errors, the summed value is corrected to the lower limit value of the tolerance for errors.

In addition, the summed value correcting part 134 performs the correction process for every fixed time period (for example, every one hour) during the time from the point in time at which charge is completed and the charger is removed to the point in time at which the electrode terminal is in the open state. In other words, the summed value correcting part 134 reads the summed value of the charge and discharge current detected by the current summing part 133 and the detected value of the voltage of the battery cell 11 for every fixed time period to perform the correction process, and temporarily stores the corrected summed value of current in a memory, not shown. Then, after that, at the time when the discharge load (the digital camera 2) is connected and the summed value correcting part 134 receives a request for outputting the summed value of current from the remaining amount computing part 211, it outputs the stored summed value of current after corrected. Thus, errors of the summed value of current particularly caused by voltage drop due to natural discharge can be reliably reduced, and the computing accuracy of the remaining amount of the battery in the remaining amount computing part 211 can be improved.

In addition, the correction process for the summed value described in FIG. 11 may be applied to the summation process of the charge current in the charge and discharge count measuring part 131. In this case, the summed value is corrected to the upper limit or the lower limit of the tolerance for errors in the case in which the summed value of the charge current is not included in the tolerance for errors corresponding to the voltage of the battery cell 11 at this time based on the same tolerance for errors as that of the summed value correcting part 134. If is sufficient that the correction process like this is performed at the same timing as the summed value correcting part 134. Thus, the measurement errors of the number of times of charges and discharges can be reduced as well.

As described above, in accordance with the battery pack 1 according to the embodiment, the accuracy for both of the summed value of current and the decay rate which are parameters necessary to compute the remaining amount of the battery can be improved. Therefore, the remaining amount of the battery can be more accurately computed, and the usable remaining time and others can be indicated and transmitted to a user.

In accordance with the battery pack according to the invention, the number of times of charges and discharges of the secondary battery is measured based on the summed value of the charge current of the secondary battery, and the decay rate is computed based on the measured result. Therefore, the accuracy of the decay rate can be more improved than the case in which the number of times of charges and discharges is measured based on the voltage and the charge and discharge current of the secondary battery. Particularly, in the case in which charges and discharges are repeated in the range of a smaller voltage difference in the secondary battery, the measurement errors of the number of times of charges and discharges can be suppressed significantly, and consequently, the computing accuracy of the decay rate can be improved. Accordingly, the remaining amount of the secondary battery is detected based on the decay rate thus computed, whereby the remaining amount can be detected more accurately.

The invention claimed is:

1. A battery pack in which a processing circuit which performs a predetermined process based on various detected values from a secondary battery is accommodated in one piece with the secondary battery, the battery pack characterized by comprising:

a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute a decay rate that indicates a degree of decay of the secondary battery based on the number of times of charges and discharges measured by the charge and discharge count measuring part; and a communicating part configured to output the decay rate computed by the decay rate computing part to an external device that is a discharge load of the secondary battery, wherein the charge current summing part sums a magnitude of the charge current for every fixed time period, and wherein the charge and discharge count measuring part decides the added value of the number of times of charges and discharges based on the summed value of the charge current for each of the fixed time periods from the charge current summing part, and adds the added value to the number of times of charges and discharges computed immediately before for output.

2. The battery pack according to claim 1, characterized in that:
the charge current summing part repeatedly sums the detected values of the charge current to a predetermined threshold, and
the charge and discharge count measuring part counts up the number of times of charges and discharges every time when the summed value of the charge current by the charge current summing part reaches threshold.

3. The battery pack according to claim 2, characterized in that:
the charge and discharge count measuring part adds the number of times of charges and discharges by a ratio of the threshold for the summed value of the charge current in full charge every time when the summed value of the charge current by the charge current summing part reaches the threshold.

4. The battery pack according to claim 1, characterized in that:
the charge and discharge count measuring part divides the summed value of the charge current for the fixed time period by the summed value of the charge current in full charge, whereby it decides the added value.

5. The batter pack according to claim 1, characterized in that:
the decay rate computing part computes the decay rate for each of the fixed time periods.

6. A battery pack in which a processing circuit which performs a predetermined process based on various detected values from a secondary battery is accommodated in one piece with the secondary battery, the battery pack characterized by comprising:
a charge current summing part configured to sum a detected value of charge current for the secondary battery;
a charge and discharge count measuring part configured to measure the number of times of charges and discharges of the secondary battery based on the summed value of the charge current by the charge current summing part;
a decay rate computing part configured to compute a decay rate that indicates a degree of decay of the secondary battery based on the number of times of charges and discharges measured by the charge and discharge count measuring part; and
a communicating part configured to output the decay rate computed by the decay rate computing part to an external device that is a discharge load of the secondary battery,
wherein the decay rate computing part associates in advance the number of times of charges and discharges with the decay rate by means of a graph having at least two points of change in a slope, and converts the number of times of charges and discharges measured by the charge and discharge count measuring part into the decay rate based on the graph.

7. The battery pack according to claim 6, characterized in that:
in the graph, a slope of the decay rate in accordance with an increase in the number of times of charges and discharges is made smaller than that in therearound in an intermediate area except areas in which the number of times of charges and discharges is the minimum and the maximum.

8. A battery pack in which a processing circuit which performs a predetermined process based on various detected values from a secondary battery is accommodated in one piece with the secondary battery, the battery pack characterized by comprising:
a charge current summing part configured to sum a detected value of charge current for the secondary battery;
a charge and discharge count measuring part configured to measure the number of times of charges and discharges of the secondary battery based on the summed value of the charge current by the charge current summing part;
a decay rate computing part configured to compute a decay rate that indicates a degree of decay of the secondary battery based on the number of times of charges and discharges measured by the charge and discharge count measuring part;
a communicating part configured to output the decay rate computed by the decay rate computing part to an external device that is a discharge load of the secondary battery;
a charge and discharge current summing part configured to sum a detected value of charge and discharge current of the secondary battery;
a voltage detecting part configured to detect a voltage between a positive electrode and a negative electrode of the secondary battery; and
a summed value correcting part configured to preset a tolerance for errors in which the summed value of charge and discharge current takes a fixed width around an approximated line that a curve associating voltage between a positive electrode and a negative electrode of the secondary battery when an electrode of the secondary battery is opened with the summed value of charge and discharge current by means of a graph, and to correct the summed value of charge and discharge current by the charge and discharge current summing part so as to be included in the tolerance for errors in accordance with a detected value of voltage at this time by the voltage detecting part,
wherein the communicating part outputs the summed value of charge and discharge current connected by the summed value correcting part to the external device together with the decay rate.

9. The battery pack according to claim 8, characterized in that:
during the time for which the electrode of the secondary battery is opened after charge of the secondary battery is completed, the summed value correcting part corrects the summed value of charge and discharge current for every fixed time period.

10. The battery pack according to claim 8, characterized in that:
the summed value correcting part corrects the summed value of charge and discharge current as well as the summed value of the charge current by the charge current summing part by means of a similar process, and supplies the corrected summed value of the charge current to the charge and discharge count measuring part.

11. A battery pack in which a processing circuit which performs a predetermined process based on various detected values from a secondary battery is accommodated in one piece with the secondary battery, the battery pack characterized by comprising:
a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute a decay rate that indicates a degree of decay of the secondary battery based on the number of times of charges and discharges measured by the charge and discharge count measuring part;

a communicating part configured to output the decay rate computed by the decay rate computing part to an external device that is a discharge load of the secondary battery;

a voltage detecting part configured to detect a voltage between a positive electrode and a negative electrode of the secondary battery; and a summed value correcting part configured to preset a tolerance for errors in which the summed value of charge current takes a fixed width around an approximated line that a curve associating voltage between a positive electrode and a negative electrode of the secondary battery when an electrode of the secondary battery is opened with the summed value of charge current by means of a graph, to correct the summed value of charge current by the charge current summing part so as to be included in the tolerance for errors in accordance with a detected value of voltage at this time by the voltage detecting part, and to supply it to the charge and discharge count measuring part.

12. An electronic appliance which operates by receiving power from a secondary battery, the electronic appliance characterized by comprising:

a detachable battery pack configured to have a processing circuit which performs a predetermined process based on various detected values from the secondary battery accommodated therein together with the secondary battery in one piece;

a first communicating part configured to communicate with the battery pack; and a battery remaining amount computing means configured to receive a summed value of charge and discharge current of the secondary battery and a decay rate that indicates a degree of decay of the secondary battery from the battery pack through the first communicating part and to compute a remaining amount of the secondary battery, wherein the battery pack includes:

a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute the decay rate based on the number of times of charges and discharges measured by the charge and discharge count measuring part;

a charge and discharge current summing part configured to sum a detected value of the charge and discharge current of the secondary battery; and a second communicating part configured to output the decay rate computing part and the summed value of charge and discharge current by the charge and discharge current summing part to the first communicating part, wherein the charge current summing part sums a magnitude of the charge current for every fixed time period, and wherein the charge and discharge count measuring part decides the added value of the number of times of charges and discharges based on the summed value of the charge current for each of the fixed time periods from the charge current summing part, and adds the added value to the number of times of charges and discharges computed immediately before for output.

13. A method of detecting a remaining amount of a battery for detecting a remaining amount of a secondary battery, the method comprising the steps of:

summing a detected value of charge current for the secondary battery by a charge current summing part disposed in a battery pack in which the secondary battery is accommodated;

measuring the number of times of charges and discharges of the secondary battery based on the summed value of the charge current by means of the charge current summing part by a charge and discharge count measuring part disposed in the battery pack;

computing a decay rate that indicates a degree of decay of the secondary battery based on the number of times of charges and discharges measured by means of the charge and discharge count measuring part by a decay rate computing part disposed in the battery pack;

summing a detected value of charge and discharge current of the secondary battery by a charge and discharge current summing part disposed in the battery pack; and computing a remaining amount of the secondary battery based on the decay rate computed by means of the decay rate computing part and the summed value of charge and discharge current by means of the charge and discharge current summing part by a battery remaining amount computing means disposed in an electronic appliance that is a discharge load of the secondary battery, wherein the charge current summing part sums a magnitude of the charge current for every fixed time period, and wherein the charge and discharge count measuring part decides the added value of the number of times of charges and discharges based on the summed value of the charge current for each of the fixed time periods from the charge current summing part, and adds the added value to the number of times of charges and discharges computed immediately before for output.

14. An electronic appliance which operates by receiving power from a secondary battery, the electronic appliance characterized by comprising:

a detachable battery pack configured to have a processing circuit which performs a predetermined process based on various detected values from the secondary battery accommodated therein together with the secondary battery in one piece;

a first communicating part configured to communicate with the battery pack; and a battery remaining amount computing means configured to receive a summed value of charge and discharge current of the secondary battery and a decay rate that indicates a degree of decay of the secondary battery from the battery pack through the first communicating part and to compute a remaining amount of the secondary battery, wherein the battery pack includes:

a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute the decay rate based on the number of times of charges and discharges measured by the charge and discharge count measuring part;

a charge and discharge current summing part configured to sum a detected value of the charge and discharge current of the secondary battery; and a second communicating part configured to output the decay rate computing part and the summed value of charge and discharge current by the charge and discharge current summing part to the first communicating part, wherein the decay rate computing part associates in advance the number of times of charges and discharges with the decay rate by means of a graph having at least two points of change in a slope, and converts the number of times of charges and discharges measured by the charge and discharge count measuring part into the decay rate based on the graph.

15. An electronic appliance which operates by receiving power from a secondary battery, the electronic appliance characterized by comprising:

a detachable battery pack configured to have a processing circuit which performs a predetermined process based on various detected values from the secondary battery accommodated therein together with the secondary battery in one piece;

a first communicating part configured to communicate with the battery pack; and a battery remaining amount computing means configured to receive a summed value of charge and discharge current of the secondary battery and a decay rate that indicates a degree of decay of the secondary battery from the battery pack through the first communicating part and to compute a remaining amount of the secondary battery, wherein the battery pack includes:

a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute the decay rate based on the number of times of charges and discharges measured by the charge and discharge count measuring part;

a charge and discharge current summing part configured to sum a detected value of the charge and discharge current of the secondary battery;

a second communicating part configured to output the decay rate computing part and the summed value of charge and discharge current by the charge and discharge current summing part to the first communicating part;

a charge and discharge current summing part configured to sum a detected value of charge and discharge current of the secondary battery;

a voltage detecting part configured to detect a voltage between a positive electrode and a negative electrode of the secondary battery; and a summed value correcting part configured to preset a tolerance for errors in which the summed value of charge and discharge current takes a fixed width around an approximated line that a curve associating voltage between a positive electrode and a negative electrode of the secondary battery when an electrode of the secondary battery is opened with the summed value of charge and discharge current by means of a graph, and to correct the summed value of charge and discharge current by the charge and discharge current summing part so as to be included in the tolerance for errors in accordance with a detected value of voltage at this time by the voltage detecting part, wherein the communicating part outputs the summed value of charge and discharge current connected by the summed value correcting part to the external device together with the decay rate.

16. An electronic appliance which operates by receiving power from a secondary battery, the electronic appliance characterized by comprising:

a detachable battery pack configured to have a processing circuit which performs a predetermined process based on various detected values from the secondary battery accommodated therein together with the secondary battery in one piece;

a first communicating part configured to communicate with the battery pack; and a battery remaining amount computing means configured to receive a summed value of charge and discharge current of the secondary battery and a decay rate that indicates a degree of decay of the secondary battery from the battery pack through the first communicating part and to compute a remaining amount of the secondary battery, wherein the battery pack includes:

a charge current summing part configured to sum a detected value of charge current for the secondary battery;

a charge and discharge count measuring part configured to measure the number of times of charges and discharges of the secondary battery based on the summed value of the charge current by the charge current summing part;

a decay rate computing part configured to compute the decay rate based on the number of times of charges and discharges measured by the charge and discharge count measuring part;

a charge and discharge current summing part configured to sum a detected value of the charge and discharge current of the secondary battery;

a second communicating part configured to output the decay rate computing part and the summed value of charge and discharge current by the charge and discharge current summing part to the first communicating part;

a voltage detecting part configured to detect a voltage between a positive electrode and a negative electrode of the secondary battery; and a summed value correcting part configured to preset a tolerance for errors in which the summed value of charge current takes a fixed width around an approximated line that a curve associating voltage between a positive electrode and a negative electrode of the secondary battery when an electrode of the secondary battery is opened with the summed value of charge current by means of a graph, to correct the summed value of charge current by the charge current summing part so as to be included in the tolerance for errors in accordance with a detected value of voltage at this time by the voltage detecting part, and to supply it to the charge and discharge count measuring part.

17. A method of detecting a remaining amount of a battery for detecting a remaining amount of a secondary battery, the method comprising the steps of:
summing a detected value of charge current for the secondary battery by a charge current summing part disposed in a battery pack in which the secondary battery is accommodated;
measuring the number of times of charges and discharges of the secondary battery based on the summed value of the charge current by means of the charge current summing part by a charge and discharge count measuring part disposed in the battery pack;
computing a decay rate that indicates a degree of decay of the secondary battery based on the number of times of charges and discharges measured by means of the charge and discharge count measuring part by a decay rate computing part disposed in the battery pack;
summing a detected value of charge and discharge current of the secondary battery by a charge and discharge current summing part disposed in the battery pack; and
computing a remaining amount of the secondary battery based on the decay rate computed by means of the decay rate computing part and the summed value of charge and discharge current by means of the charge and discharge current summing part by a battery remaining amount computing means disposed in an electronic appliance that is a discharge load of the secondary battery,
wherein the decay rate computing part associates in advance the number of times of charges and discharges with the decay rate by means of a graph having at least two points of change in a slope, and converts the number of times of charges and discharges measured by the charge and discharge count measuring part into the decay rate based on the graph.

18. A method of detecting a remaining amount of a battery for detecting a remaining amount of a secondary battery, the method comprising the steps of:
summing a detected value of charge current for the secondary battery by a charge current summing part disposed in a battery pack in which the secondary battery is accommodated;
measuring the number of times of charges and discharges of the secondary battery based on the summed value of the charge current by means of the charge current summing part by a charge and discharge count measuring part disposed in the battery pack;
computing a decay rate that indicates a degree of decay of the secondary battery based on the number of times of charges and discharges measured by means of the charge and discharge count measuring part by a decay rate computing part disposed in the battery pack;
summing a detected value of charge and discharge current of the secondary battery by a charge and discharge current summing part disposed in the battery pack;
computing a remaining amount of the secondary battery based on the decay rate computed by means of the decay rate computing part and the summed value of charge and discharge current by means of the charge and discharge current summing part by a battery remaining amount computing means disposed in an electronic appliance that is a discharge load of the secondary battery;
detecting a voltage by a voltage detecting part between a positive electrode and a negative electrode of the secondary battery; and
presetting a tolerance for errors by a summed value correcting part in which the summed value of charge and discharge current takes a fixed width around an approximated line that a curve associating voltage between a positive electrode and a negative electrode of the secondary battery when an electrode of the secondary battery is opened with the summed value of charge and discharge current by means of a graph, and to correct the summed value of charge and discharge current by the charge and discharge current summing part so as to be included in the tolerance for errors in accordance with a detected value of voltage at this time by the voltage detecting part,
wherein the charge and discharge current summing part is configured to sum a detected value of charge and discharge current of the secondary battery, and
wherein the communicating part outputs the summed value of charge and discharge current connected by the summed value correcting part to the external device together with the decay rate.

19. A method of detecting a remaining amount of a battery for detecting a remaining amount of a secondary battery, the method comprising the steps of:
summing a detected value of charge current for the secondary battery by a charge current summing part disposed in a battery pack in which the secondary battery is accommodated;
measuring the number of times of charges and discharges of the secondary battery based on the summed value of the charge current by means of the charge current summing part by a charge and discharge count measuring part disposed in the battery pack;
computing a decay rate that indicates a degree of decay of the secondary battery based on the number of times of charges and discharges measured by means of the charge and discharge count measuring part by a decay rate computing part disposed in the battery pack;
summing a detected value of charge and discharge current of the secondary battery by a charge and discharge current summing part disposed in the battery pack;
computing a remaining amount of the secondary battery based on the decay rate computed by means of the decay rate computing part and the summed value of charge and discharge current by means of the charge and discharge current summing part by a battery remaining amount computing means disposed in an electronic appliance that is a discharge load of the secondary battery;
detecting a voltage by a voltage detecting part between a positive electrode and a negative electrode of the secondary battery; and
presetting a tolerance for errors by a summed value correcting part in which the summed value of charge current takes a fixed width around an approximated line that a curve associating voltage between a positive electrode and a negative electrode of the secondary battery when an electrode of the secondary battery is opened with the summed value of charge current by means of a graph, to correct the summed value of charge current by the charge current summing part so as to be included in the tolerance for errors in accordance with a detected value of voltage at this time by the voltage detecting part, and to supply it to the charge and discharge count measuring part.

* * * * *